(12) United States Patent
Hsieh

(10) Patent No.: US 10,056,067 B2
(45) Date of Patent: Aug. 21, 2018

(54) AUDIO PROCESSING DEVICE AND AUDIO PROCESSING METHOD

(71) Applicant: Realtek Semiconductor Corporation, Hsinchu (TW)

(72) Inventor: Pei-Wen Hsieh, Kaohsiung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/696,162

(22) Filed: Sep. 5, 2017

(65) Prior Publication Data

US 2018/0204560 A1    Jul. 19, 2018

(30) Foreign Application Priority Data

Jan. 17, 2017   (TW) .............................. 106101548 A

(51) Int. Cl.
*G10K 11/178*    (2006.01)
*H03G 5/16*       (2006.01)

(52) U.S. Cl.
CPC ........ *G10K 11/178* (2013.01); *G10K 11/1782* (2013.01); *H03G 5/165* (2013.01); *G10K 2210/1081* (2013.01); *G10K 2210/3011* (2013.01); *G10K 2210/3028* (2013.01); *G10K 2210/3044* (2013.01)

(58) Field of Classification Search
CPC .............................. H03G 5/165; G10K 11/175
See application file for complete search history.

(56) References Cited

U.S. PATENT DOCUMENTS

| 4,494,074 A | 1/1985 | Bose |
| 9,202,456 B2 | 12/2015 | Lee et al. |
| 9,236,041 B2 | 1/2016 | Asada et al. |
| 2010/0296668 A1* | 11/2010 | Lee ..................... G10K 11/1784 381/94.7 |
| 2011/0090773 A1* | 4/2011 | Yu ..................... G11B 20/10009 369/47.15 |
| 2011/0116536 A1* | 5/2011 | Tsuie ................ H04L 25/03038 375/232 |
| 2011/0293103 A1* | 12/2011 | Park .................... G10K 11/1782 381/57 |

* cited by examiner

*Primary Examiner* — Mohammad Islam
(74) *Attorney, Agent, or Firm* — CKC & Partners Co., Ltd.

(57) ABSTRACT

An audio processing device includes a first anti-noise filter, an output circuit, and an equalizer circuit. The first anti-noise filter is configured to process a digital signal, in order to generate a noise cancellation signal. The output circuit is configured to mix the noise cancellation signal with an equalized signal to generate a mixed signal, and to generate a sound output signal based on the mixed signal, in which the digital signal is associated with the sound output signal. The equalizer circuit is configured to receive an input signal, and to adjust at least one parameter of the equalizer circuit according to the equalized signal and the digital signal, in order to process the input signal to generate the equalized signal.

20 Claims, 5 Drawing Sheets

AUDIO PROCESSING DEVICE AND AUDIO PROCESSING METHOD

RELATED APPLICATIONS

This application claims priority to Taiwan Application Serial Number 106101548, filed Jan. 17, 2017, which is herein incorporated by reference.

BACKGROUND

Technical Field

The present disclosure relates to an audio processing device. More particularly, the present disclosure relates to an audio processing device that detects status of headphone and a method thereof.

Description of Related Art

In order to provide higher sound quality, an active noise cancellation mechanism is commonly applied to a headphone to reduce disturbances caused by environmental noises. In some approaches, the active noise cancellation mechanism is implemented with a feedback circuit. In these approaches, after an audio signal is outputted from a speaker, this audio signal is received by an internal microphone and transmitted back to a mixer device. In order to prevent the original audio signal from being affected by the received audio signal, an equalizer is used to provide compensation on this matter.

In general, the received audio signal changes with external factors (e.g., locations of the headphone, shape of user's ear, etc.). However, in current approaches, the equalizer is only able to provide a fixed transfer function for compensation. As a result, when the received audio signal changes, the equalizer is unable to provide a corresponding audio effect.

SUMMARY

One aspect of the present disclosure is to provide an audio processing device includes a first anti-noise filter, an output circuit, and an equalizer circuit. The first anti-noise filter is configured to process a digital signal, in order to generate a noise cancellation signal. The output circuit is configured to mix the noise cancellation signal with an equalized signal to generate a mixed signal, and to generate a sound output signal based on the mixed signal, in which the digital signal is associated with the sound output signal. The equalizer circuit is configured to receive an input signal, and to adjust at least one parameter of the equalizer circuit according to the equalized signal and the digital signal, in order to process the input signal to generate the equalized signal.

Another aspect of the present disclosure is to provide an audio processing method that includes: processing a digital signal to generate a noise cancellation signal; mixing the noise cancellation signal with an equalized signal to generate a mixed signal, and outputting an sound output signal based on the mixed signal, in which the digital signal is associated with the sound output signal; and adjust at least one parameter according to the equalized signal and the digital signal, in order to process an input signal to generate the equalized signal.

As discussed above, the audio device and the method provided in the present disclosure can detect the locations of the headphone or shapes of ears to dynamically adjust parameters of the equalizer, in order to keep the sound effect of the final output.

BRIEF DESCRIPTION OF THE DRAWINGS

Aspects of the present disclosure are best understood from the following detailed description when read with the accompanying figures.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. In this document, the term "coupled" or "connected" indicates that two or more elements are in "direct" physical or electrical contact with each other, that two or more elements are "indirect" physical or electrical contact with each other, or that two or more elements cooperate or interact with each other.

Figure 1:
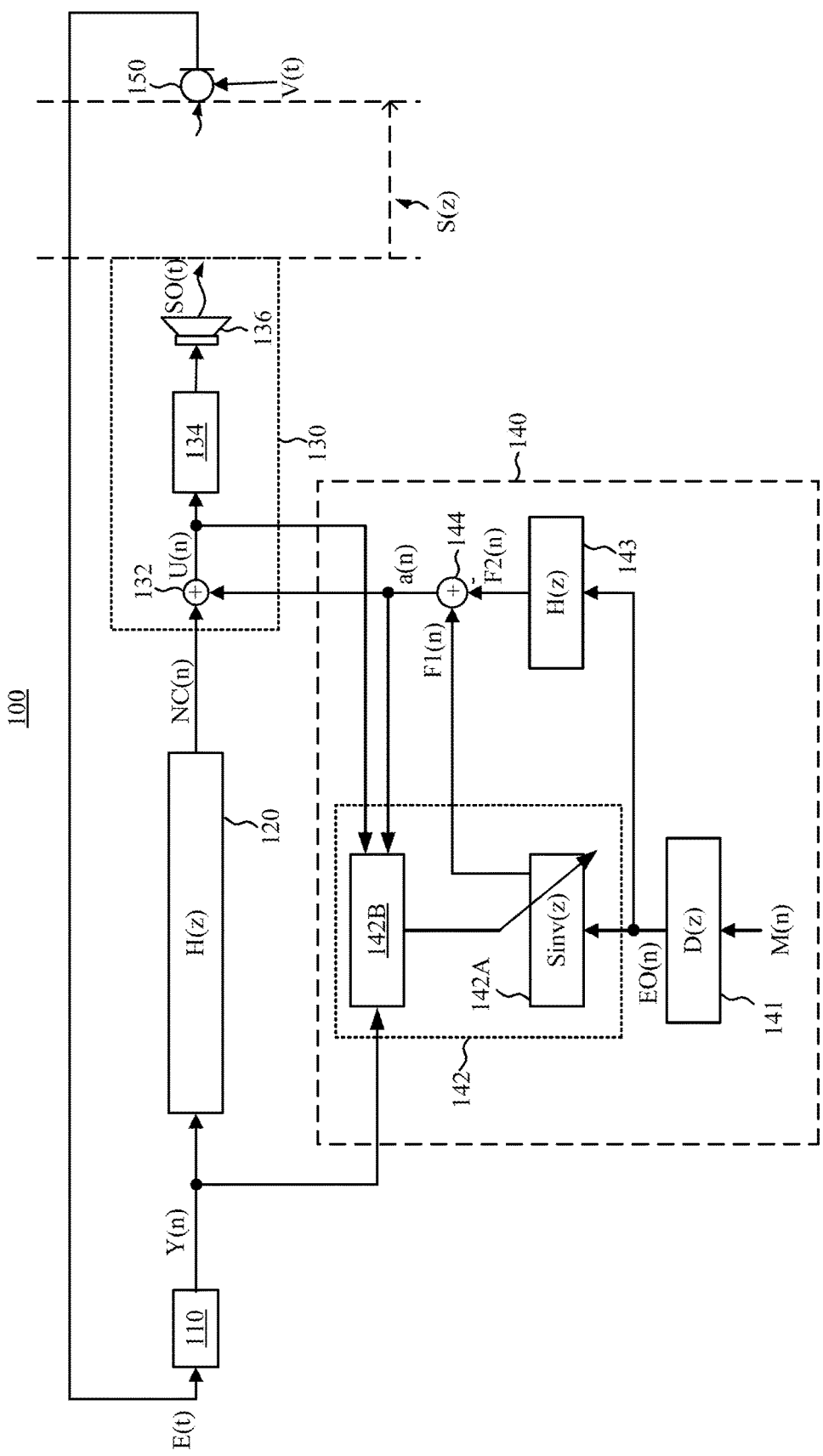
FIG. 1 is a schematic diagram of an audio processing device, according to some embodiments of the present disclosure.

FIG. 1 is a schematic diagram of an audio processing device 100, according to some embodiments of the present disclosure. In some embodiments, the audio processing device 100 is implemented on a headphone. In some embodiments, the audio processing device 100 has an active mechanism for reducing noises, in order to reduce disturbances caused by environmental noises.

In some embodiments, the audio processing device 100 includes an analog-to-digital converter (ADC) 110, an anti-noise filter 120, an output circuit 130, an equalizer circuit 140, and an audio-to-electric conversion device 150.

In some embodiments, the audio-to-electric conversion device 150 is disposed within a shell of a headphone, and is configured to receive a sound output signal SO(t) and a noise signal V(t). The audio-to-electric conversion device 150 converts the received audio signal to an electrical signal E(t). In some embodiments, the audio-to-electric conversion device 150 is implemented with a microphone, but the present disclosure is not limited thereto.

The ADC 110 is configured to convert the electrical signal E(t) to a digital signal Y(n). The anti-noise filter 120 is coupled to the ADC 110 to receive the digital signal Y(n).

The anti-noise filter 120 is configured to process the electrical signal E(t), in order to generate a noise cancellation signal NC(n). In some embodiments, the noise cancellation signal NC(n) is employed to reduce impacts from the environmental noises (e.g., the noise signal V(t)). In some embodiments, the anti-noise filter 120 may be an adaptive filter.

The output circuit 130 includes an arithmetic circuit 132, a digital-to-analog converter (DAC) 134, and an electric-to-audio conversion device 136. The arithmetic circuit 132 receives the noise cancellation signal NC(n), and is configured to mix the noise cancellation signal NC(n) with an equalized signal a(n), in order to generate a mixed signal U(n). In some embodiments, the arithmetic circuit 132 may be implemented with an adder, and/or a synthesizer. The DAC 134 is coupled to the arithmetic circuit 132, and is configured to convert the mixed signal U(n). The electric-to-audio conversion device 136 is coupled to the DAC 134, and is configured to output the signal, which is converted by the DAC 134 according to the mixed signal U(n), as the sound output signal SO(t). In some embodiments, the electric-to-audio conversion device 136 may be implemented with a speaker.

In some embodiments, the equalizer circuit 140 is configured to adjust signal components of the input signal M(n) at each band, in order to generate different sound effects. In some embodiments, the equalizer circuit 140 is configured to adjust at least one parameter of the equalizer circuit 140 according to the equalized signal a(n), the mixed signal U(n), and digital signal Y(n), in order to determine the equalized signal a(n).

In the example of FIG. 1, the equalizer circuit 140 includes an equalizer 141, an adaptive filter 142, an anti-noise filter 143, and an arithmetic circuit 144. The equalizer 141 is configured to process the input signal M(n) to generate an equalized output signal EO(n). In some embodiments, the input signal M(n) is an audio signal provided from an audio source.

The adaptive filter 142 is configured to process the equalized output signal EO(n) according to the mixed signal U(n), the digital signal Y(n), and the equalized signal a(n). In some embodiments, the adaptive filter 142 includes a filter circuit 142A and a control circuit 142B. The filter circuit 142A is configured to provide a transfer function Sinv(z) to process the equalized output signal EO(n), in order to generate a filtered signal F1($n$). The control circuit 142B is configured to adjust at least one weighted coefficient (e.g., $w_k$ as discussed below) according to an error signal e(n) (not shown) on condition that a power of the equalized signal a(n) is higher than a predetermined value THD, in order to update the transfer function Sinv(z). The detail operations regarding herein is provided with reference to FIG. 2A in later paragraphs. In various embodiments, the adaptive filter 142 may be implemented with various digital circuits, which include, for example, finite impulse response filters, etc., but the present disclosure is not limited thereto.

In some embodiments, the anti-noise filter 143 is configured to process the equalized output signal EO(n), in order to generate a filtered signal F2($n$). The arithmetic circuit 144 is coupled to the equalizer circuit 140 and the anti-noise filter 143 to receive the filtered signal F1($n$) and the filtered signal F2($n$), respectively. In some embodiments, the arithmetic circuit 144 is configured to subtract the filtered signal F2($n$) from the filtered signal F1($n$), in order to generate the equalized signal a(n).

In some embodiments, if there is no equalizer circuit 140, the input signal M(n) is directly transmitted to the arithmetic circuit 132 to generate the mixed signal U(n). Under this condition, Z-transform is used to analyze the audio processing device 100, and it is able to derive the following equation (1):

$$Y(z) = M(z)\left[\frac{S(z)}{1-S(z)H(z)}\right] + V(z)\left[\frac{1}{1-S(z)H(z)}\right], \quad (1)$$

where M(z) indicates the Z-transform of the input signal M(n), Y(z) indicates the Z-transform of the digital signal Y(n), H(z) indicates a transfer function of the anti-noise filter 120, V(z) is a Z-transform of a digital signal V(n) corresponding to the noise signal V(T), and S(z) is an equivalent transfer function between electric-to-audio conversion device 136 and audio-to-electric conversion device 150. According to the equation (1), it is able to derive that a transfer function between the input signal M(n) and the ADC 110 is equal to S(z)/[1−S(z)H(z)].

Therefore, In the embodiments using the equalizer circuit 140, the transfer function E(z) of the equalizer circuit 140 can be expressed as the following equation (2):

$$E(z) = D(z)\left[\frac{1}{S(z)} - H\right], \quad (2)$$

where D(z) is a transfer function of the equalizer 141 (i.e., a target transfer function for the input signal M(n) inputted to ear). In some embodiments, the transfer function D(z) and the transfer function H(z) are predetermined and known values, and the transfer function S(z) may be varied with different locations of the headphone or with different shapes of ear. In some embodiments, the equalizer circuit 140 in FIG. 1 is designed according to the above equation (2).

In some approaches, an audio process device only employs an equalizer having a fixed transfer function to adjust the input signal M(n). In these approaches, the equalizer is not dynamically adjusted according the variation of the transfer function S(z). Accordingly, the sound effect introduced by the equalizer is reduced. Compared with the above approaches, with the arrangements of the adaptive filter 142, the transfer function S(z) can be estimated according to the mixed signal U(n) and/or the equalized signal a(n). As a result, the audio processing device 100 is able to dynamically adjust the sound effect according to different locations of the headphone or different shapes of ear.

Figure 2A:
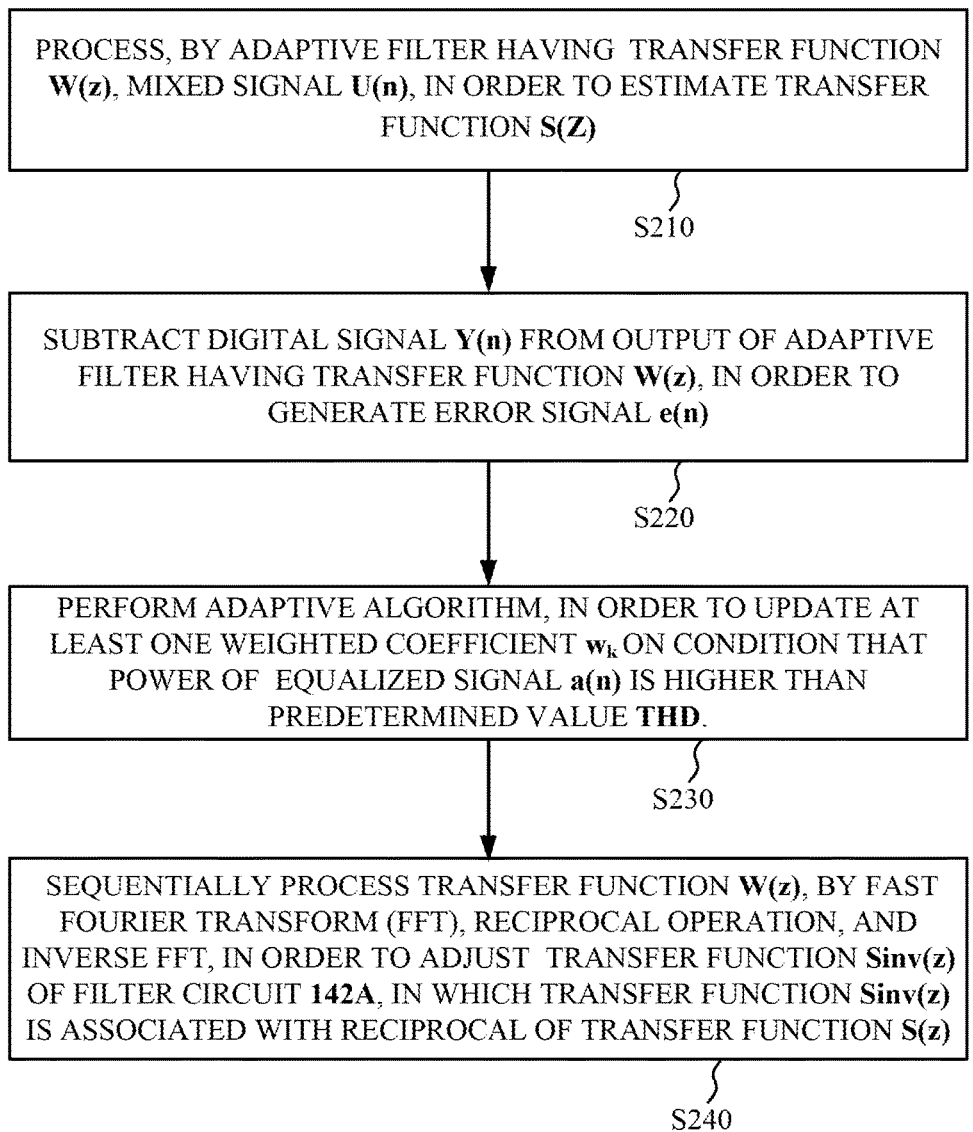
FIG. 2A is a flow chart of a method, performed by the control circuit in FIG. 1, according to some embodiments of the present disclosure.

FIG. 2A is a flow chart of a method 200, performed by the control circuit 142B in FIG. 1, according to some embodiments of the present disclosure.

In some embodiments, the control circuit 142B may be implemented with hardware, software, or a combination thereof. In some embodiments, the hardware includes a processor, a micro-controller, an application-specific integrated circuit, or various types of digital signal processing circuits.

As shown in FIG. 2A, in operation S210, the adaptive filter having a transfer function W(z) processes the mixed signal U(n), in order to estimate the transfer function S(z). In some embodiments, the adaptive filter is implemented with a FIR filter, and the transfer function W(z) can be expressed as $W(z)=w_0+w_1 z^{-1}+w_2 z^{-2}+ \ldots +w_{L-1} z^{-L+1}$.

In operation S220, the digital signal Y(n) is subtracted from an output of the adaptive filter having the transfer function W(z), in order to generate an error signal e(n).

In operation S230, an adaptive algorithm is performed, in order to update at least one weighted coefficient $w_k$ on condition that a power of the equalized signal a(n) is higher than a predetermined value THD.

For example, as shown in FIG. 1, by using the Z-transform to analyze the audio processing device 100, it is able to derive the following equation (3):

$$Y(z) = A(z)\left[\frac{S(z)}{1-S(z)H(z)}\right] + V(z)\left[\frac{1}{1-S(z)H(z)}\right] \quad (3)$$
$$U(z) = A(z)\left[\frac{1}{1-S(z)H(z)}\right] + V(z)\left[\frac{H(z)}{1-S(z)H(z)}\right],$$

where A(z) is the Z-transform of the equalized signal a(n). According to the above equation, it is able to derive the following equation (4) if the power of the equalized signal a(n) is higher than the power of the noise signal V(t).

$$Y(z) \approx A(z)\left[\frac{S(z)}{1-S(z)H(z)}\right] \quad (4)$$
$$U(z) \approx A(z)\left[\frac{1}{1-S(z)H(z)}\right].$$

Under this condition, the ratio of Y(z) to U(z) is S(z). In other words, when the power of the equalized signal a(n) is higher than the power of the digital signal V(n) to which the noise signal V(t) corresponds, the transfer function W(z) converges to the transfer function S(z). Alternatively, when the power of the equalized signal a(n) is lower than the power of the digital signal V(n), the transfer function W(z) only converges to the transfer function 1/H(z).

Accordingly, based on the above relationship, it is able to determine whether the power of the equalized signal a(n) is sufficient to be higher than the power of the digital signal V(n) by setting the predetermined value THD. In some embodiments, the adaptive algorithm in operation S230 is expressed as:

if $a[n]^2$ > THD : $w_k = w_k + \mu e(n) \times U(n-k)$, k = 0 ~ L − 1;
else : $w_k = w_k$, where the error signal e(n) is generated based on the mixed signal U(n) and the digital signal Y(n). For example, the error signal e(n) is a difference between the output of the adaptive filter having the transfer function W(z) and the digital signal Y(n), $w_k$ is the weighted coefficients of the transfer function W(z), $a[n]^2$ is the power of the equalized signal a(n), and $\mu$ is a step-size.

With continued reference to FIG. 2A, in operation S240, the transfer function W(z) is sequentially processed by a fast Fourier transform (FFT), a reciprocal operation, and an inverse FFT, in order to adjust a transfer function Sinv(z) of the filter circuit 142A, in which the transfer function Sinv(z) is associated with the reciprocal of the transfer function S(z). For example, in some embodiments, the transfer function Sinv(z) may be substantially configured to be the reciprocal of the transfer function S(z).

With the processes of the operation S240, it is able to estimate 1/S(z) (i.e., the transfer function Sinv(z)) in the equation (2). Effectively, the equalizer circuit 140 performs operations corresponding to the equation (2) to process the input signal M(n), in order to dynamically adjust the sound effect according to the transfer function S(z).

Figure 2B:
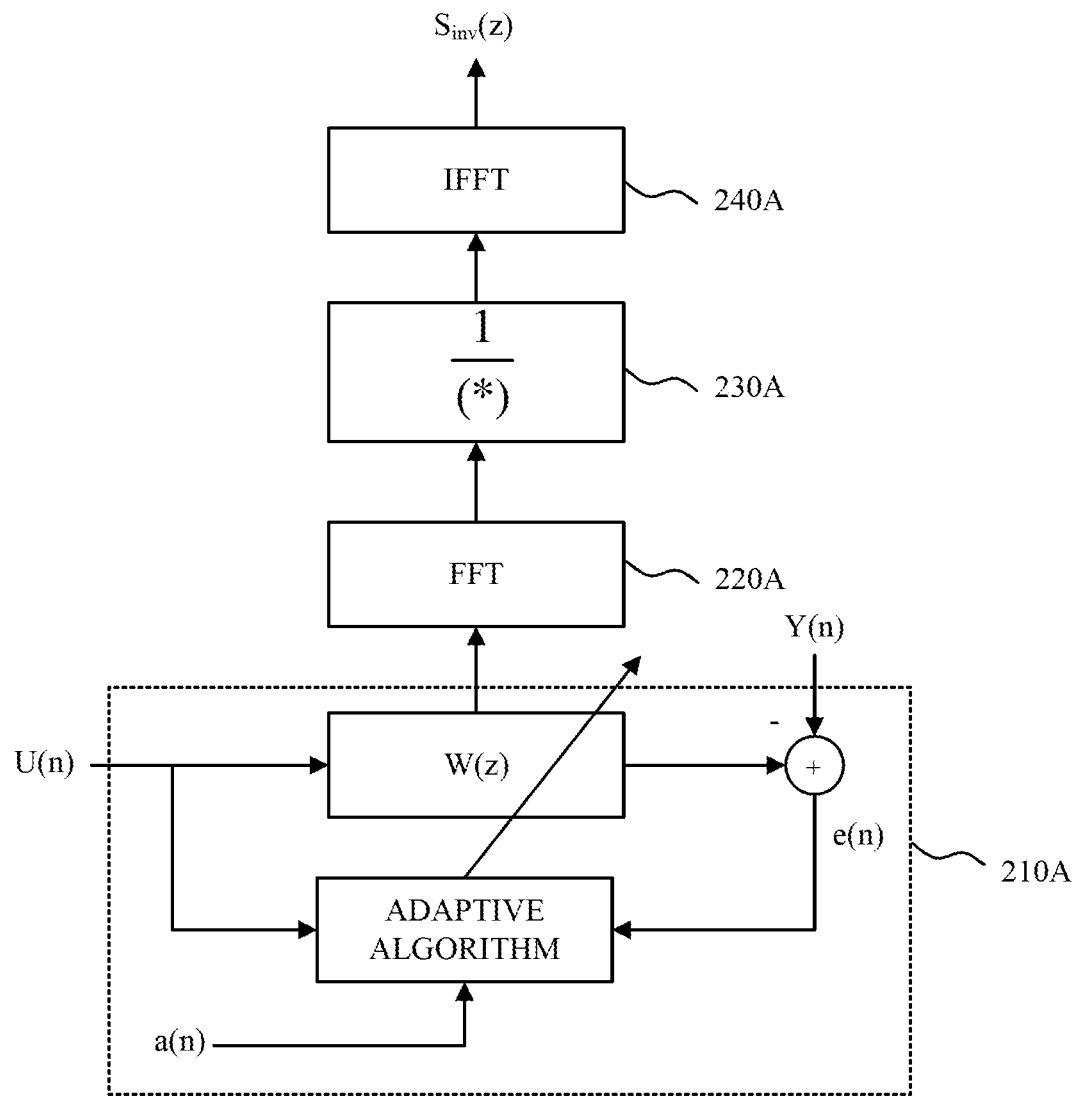
FIG. 2B is a functional block diagram for performing the method in FIG. 2A, according to some embodiments of the present disclosure.

FIG. 2B is a functional block diagram for performing the method 200 in FIG. 2A, according to some embodiments of the present disclosure. In some embodiments, the adaptive filter 142 may be implemented with functional units in FIG. 2B.

For example, a unit 210A is configured to perform the operations S210, S220, and S230 in FIG. 2A. A unit 220A is configured to perform the FFT of the operation S240 in FIG. 2A. A unit 230A is configured to perform the reciprocal operation (which is expressed as (1/*)) of the operation S240 in FIG. 2A. A unit 240A is configured to perform the IFFT of the operation S240 in FIG. 2A. The functional blocks in FIG. 2B are given for illustrative purposes only, and the present disclosure is not limited thereto.

Figure 3:
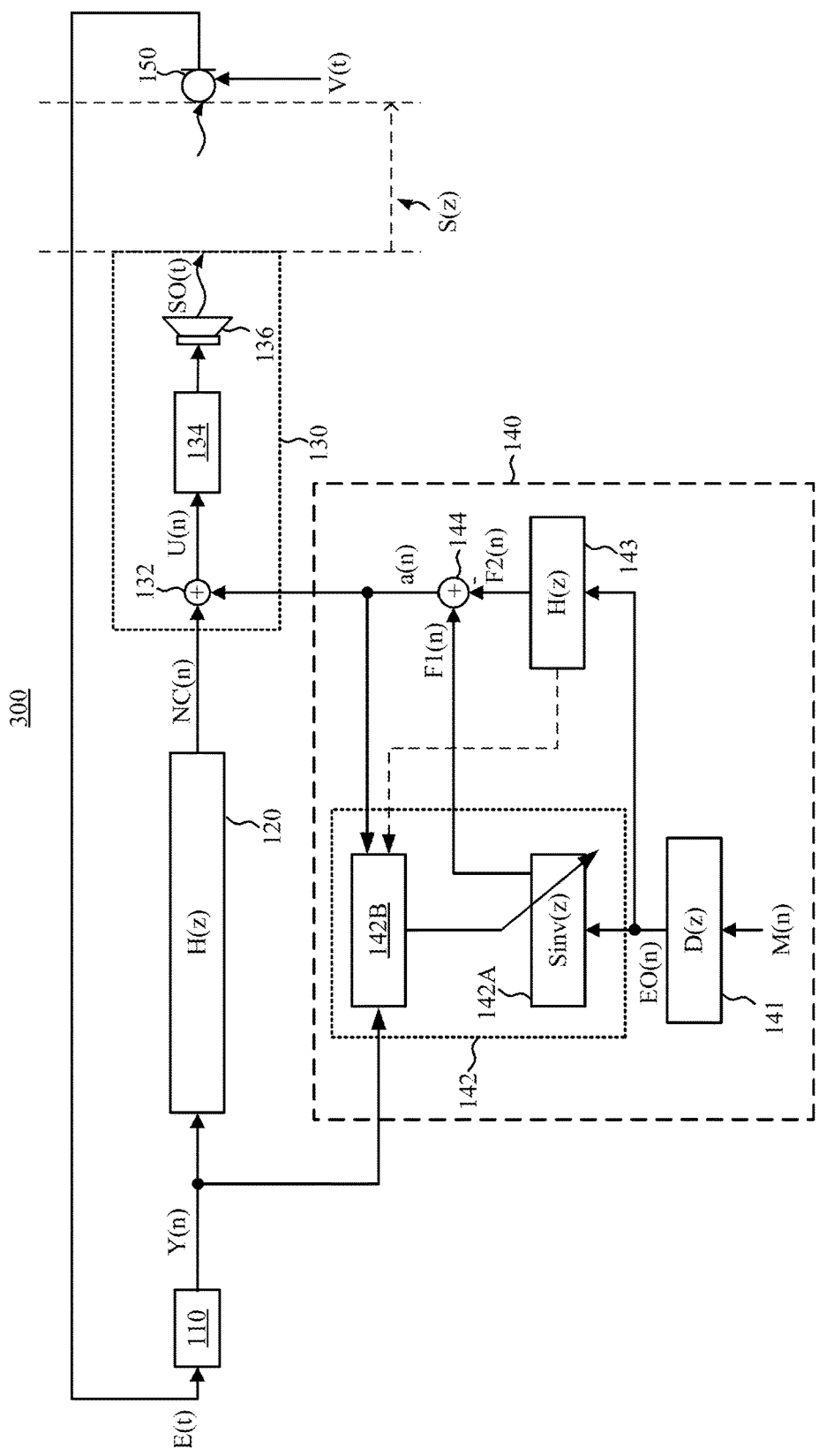
FIG. 3 is a schematic diagram of an audio processing device, in accordance with some embodiments of the present disclosure.

FIG. 3 is a schematic diagram of an audio processing device 300, in accordance with some embodiments of the present disclosure. Like elements in FIG. 3 are designated with the same reference numbers shown in FIG. 1 for ease of understanding.

Compared with FIG. 1, the control circuit 142B of the audio processing device 300 adjusts the at least one weighted coefficient $w_k$ of the transfer function W(z) according to only the equalized signal a(n) and the digital signal Y(n). For example, compared with the control circuit 142B in FIG. 1, in operation S210, the control circuit 142B in this example is configured to process the equalized signal a(n) by the adaptive filter having the transfer function W(z), in order to estimate the transfer function S(z). In this example, the error signal e(n) is generated based on the equalized signal a(n) and the digital signal Y(n). For example, the error signal e(n) is a difference between the output of the adaptive filter having the transfer function W(z) and the digital signal Y(n). In other words, in this example, the unit 210A in FIG. 2B is able to estimate the transfer function S(z) without receiving the mixed signal U(n).

For example, according to the above equation (3), when the power of the equalized signal a(n) is higher than the power of the digital signal V(n), it is able to derive the following equation (4):

$$Y(z) \approx A(z)\left[\frac{S(z)}{1-S(z)H(z)}\right]. \quad (4)$$

Under this condition, Y(z)/A(z)=S(z)/[1−S(z)H(z)]. As a result, the transfer function W(z) converges to S(z)/[1−S(z)H(z)], and the transfer function Sinv(z) converges to 1/S(z)−H(z). Thus, when the transfer function 1/S(z) is sufficiently larger than the transfer function H(z), the transfer function Sinv(z) is determined to be about 1/S(z). Alternatively, when the transfer function 1/S(z) is less than the transfer function H(z), an error of the transfer function Sinv(z) is determined, by analysis, to be only about 6 decibel (dB). Accordingly, under various conditions, the control circuit 142B in this example is sufficient to estimate the transfer function Sinv(z).

In the various embodiments discussed above, various circuits in the audio processing devices 100 and 300 can be implemented with various digital signal processing circuits. Alternatively, the operations in the above embodiments can be implemented with a state machine, and is implemented with hardware, software, or a combination thereof. Various implementations to implement elements and functions thereof in the audio processing devices 100 and 300 are within the contemplated scope of the present disclosure.

Figure 4:
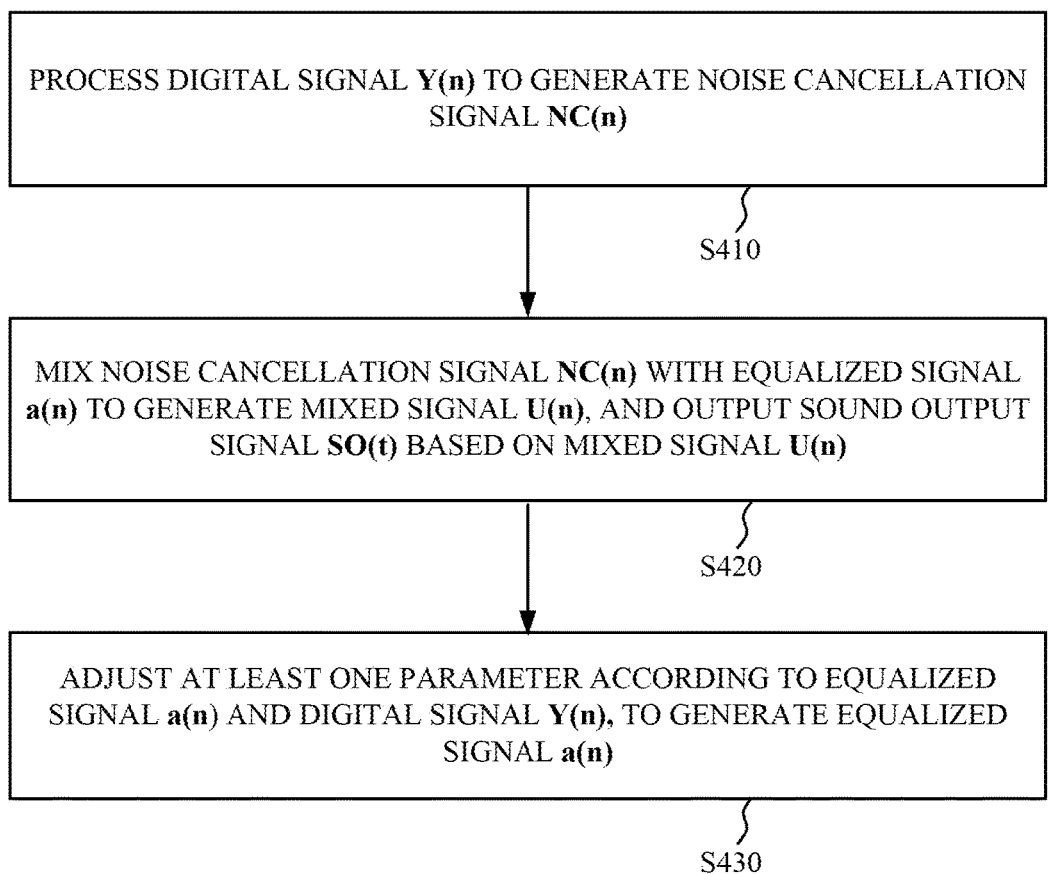
FIG. 4 is a flow chart of an audio processing method, according to some embodiments of the present disclosure.

FIG. 4 is a flow chart of an audio processing method 400, according to some embodiments of the present disclosure. In operation S410, the digital signal Y(n) is processed to generate the noise cancellation signal NC(n).

For illustration, as shown in FIG. 1, the anti-noise filter 120 is configured to process the digital signal Y(n) to generate the noise cancellation signal NC(n), in which the digital signal Y(n) is generated by using the ADC 110 to convert the electrical signal E(t).

In operation S420, the noise cancellation signal NC(n) and the equalized signal a(n) are mixed to generate the mixed signal U(n), and the sound output signal SO(t) is outputted based on the mixed signal U(n). For illustration, as described above, the operation S420 may be performed by the output circuit 130 in FIG. 1.

In operation S430, at least one parameter is adjusted according to the equalized signal a(n) and the digital signal Y(n) to generate the equalized signal a(n). For example, as described above, the method 200 can be performed by the control circuit 142B in FIG. 1 or 3, in order to adjust the at least one weighted coefficient $w_k$, in which the weighted coefficient $w_k$ is associated with the transfer function Sinv(z) of the filter circuit 142A. As a result, the equalized signal a(n) is dynamically adjusted according to locations of the headphone or different shapes of ear, in order to keep the sound effect of the final output.

The above description of the method 400 includes exemplary operations, but the operations of the method 400 are not necessarily performed in the order described above. The order of the operations of the method 400 can be changed, or the operations can be executed simultaneously or partially simultaneously as appropriate, in accordance with the spirit and scope of various embodiments of the present disclosure.

As discussed above, the audio device and the method provided in the present disclosure can detect the locations of the headphone or shapes of ears to dynamically adjust parameters of the equalizer, in order to keep the sound effect of the final output.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An audio processing device, comprising:
a first anti-noise filter configured to process a digital signal, in order to generate a noise cancellation signal;
an output circuit configured to mix the noise cancellation signal with an equalized signal to generate a mixed signal, and to generate a sound output signal based on the mixed signal, wherein the digital signal is associated with the sound output signal, and the equalized signal is generated from a first filtered signal and a second filtered signal; and
an equalizer circuit comprising:
an equalizer configured to process an input signal to generate an equalized output signal; and
a plurality of filtering circuits configured to process the equalized output signal based on at least one parameter, in order to generate the first filtered signal according to the equalized signal and the digital signal and to generate the second filtered signal.

2. The audio processing device of claim 1, wherein the output circuit comprises:
an arithmetic circuit configured to mix the noise cancellation signal with the equalized signal, in order to generate the mixed signal;
a digital-to-analog converter configured to covert the mixed signal; and
an electric-to-audio conversion device configured to output the sound output signal according to the converted mixed signal.

3. The audio processing device of claim 2, further comprising:
an audio-to-electric conversion device configured to generate an electrical signal based on a noise signal and the sound output signal; and
an analog-to-digital converter configured to covert the electrical signal to the digital signal.

4. The audio processing device of claim 3, wherein a first transfer function is present between the electric-to-audio conversion device and the audio-to-electric conversion device, the plurality of filtering circuits comprise an adaptive filter that has a second transfer function, the at least one parameter is associated with at least one weighted coefficient of the second transfer function, and the second transfer function is associated with a reciprocal of the first transfer function.

5. The audio processing device of claim 1, wherein the plurality of filtering circuits comprise an adaptive filter, and the at least one parameter is at least one weighted coefficient of the adaptive filter.

6. The audio processing device of claim 1, wherein the equalizer circuit comprises an arithmetic circuit configured to subtract the second filtered signal from the first filtered signal, in order to generate the equalized signal, and the plurality of filtering circuits comprise:
an adaptive filter configured to process the equalized output signal according to the mixed signal, the equalized signal, and the digital signal, in order to generate the first filtered signal; and
a second anti-noise filter configured to process the equalized output signal, in order to generate the second filtered signal.

7. The audio processing device of claim 6, wherein the adaptive filter comprises:
a filter circuit configured to provide a transfer function to process the equalized output signal, in order to generate the first filtered signal; and
a control circuit configured to adjust the at least one parameter according to an error signal if a power of the equalized signal is higher than a predetermined value, in order to update the transfer function,
wherein the error signal is generated based on the mixed signal and the digital signal, and the at least one parameter is associated with at least one weighted coefficient of the transfer function.

8. The audio processing device of claim 6, wherein a transfer function of the second anti-noise filter is the same as a transfer function of the first anti-noise filter.

9. The audio processing device of claim 1, wherein the equalizer circuit comprises an arithmetic circuit configured to subtract the second filtered signal from the first filtered signal, in order to generate the equalized signal, and the plurality of filtering circuits comprise:

an adaptive filter configured to process the equalized output signal according to the equalized signal and the digital signal, in order to generate the first filtered signal; and a second anti-noise filter configured to process the equalized output signal, in order to generate the second filtered signal.

10. The audio processing device of claim 9, wherein the adaptive filter comprises:

a filter circuit configured to provide a transfer function to process the equalized output signal, in order to generate the first filtered signal; and a control circuit configured to adjust the at least one parameter according to an error signal if a power of the equalized signal is higher than a predetermined value, in order to update the transfer function, wherein the error signal is generated based on the equalized signal and the digital signal, and the at least one parameter is associated with at least one weighted coefficient of the transfer function.

11. The audio processing device of claim 9, wherein a transfer function of the second anti-noise filter is the same as a transfer function of the first anti-noise filter.

12. An audio processing method, comprising:

processing a digital signal to generate a noise cancellation signal;

mixing the noise cancellation signal with an equalized signal to generate a mixed signal, and outputting an sound output signal based on the mixed signal, wherein the digital signal is associated with the sound output signal, and the equalized signal is generated from a first filtered signal and a second filtered signal;

processing an input signal to generate an equalized output signal; and processing, by a plurality of filtering circuits of an equalizer circuit, the equalized output signal based on at least one parameter, in order to generate the first filtered signal according to the equalized signal and the digital signal and to generate the second filtered signal.

13. The audio processing method of claim 12, wherein the second filtered signal is subtracted from the first filtered signal, in order to generate the equalized signal, and processing the equalized output signal comprises:

processing, by an adaptive filter of the plurality of filtering circuits, the equalized output signal according to the mixed signal, the equalized signal, and the digital signal, in order to generate the first filtered signal; and processing, by an anti-noise filter of the plurality of filtering circuits, the equalized output signal to generate the second filtered signal.

14. The audio processing method of claim 13, wherein generating the first filtered signal comprises:

providing, by a filter circuit of the adaptive filter, a transfer function to process the equalized output signal; and adjusting the at least one parameter according to an error signal if a power of the equalized signal is higher than a predetermined value, in order to update the transfer function, wherein the error signal is generated based on the mixed signal and the digital signal, and the at least one parameter is associated with at least one weighted coefficient of the transfer function.

15. The audio processing method of claim 13, wherein the noise cancellation signal is generated based on a first transfer function, the first filtered signal is generated based on a second transfer function, and the first transfer function is the same as the second transfer function.

16. The audio processing method of claim 12, wherein the second filtered signal is subtracted from the first filtered signal, in order to generate the equalized signal, and processing the equalized output signal comprises:

processing, by an adaptive filter of the plurality of filtering circuits, the equalized output signal according to the equalized signal and the digital signal, in order to generate the first filtered signal; and processing, by an anti-noise filter of the plurality of filtering circuits, the equalized output signal to generate the second filtered signal.

17. The audio processing method of claim 16, wherein generating the first filtered signal comprises:

providing, by a filter circuit of the adaptive filter, a transfer function to process the equalized output signal; and adjusting the at least one parameter according to an error signal if a power of the equalized signal is higher than a predetermined value, in order to update the transfer function, wherein the error signal is generated based on the equalized signal and the digital signal, and the at least one parameter is associated with at least one weighted coefficient of the transfer function.

18. The audio processing method of claim 12, wherein generating the sound output signal comprises:

mixing the noise cancellation signal with the equalized signal, in order to generate the mixed signal;

converting, by a digital-to-analog converter, the mixed signal; and outputting, by an electric-to-audio conversion device, the sound output signal according to the converted mixed signal.

19. The audio processing method of claim 18, further comprising:

generating, by an audio-to-electric conversion device, an electrical signal based on a noise signal and the sound output signal; and converting, by an analog-to-digital converter, the electrical signal to the digital signal.

20. The audio processing method of claim 19, wherein a first transfer function is present between the electric-to-audio conversion device and the audio-to-electric conversion device, the equalized signal is generated by the equalizer circuit, the plurality of filtering circuits comprise an adaptive filter that has a second transfer function, the at least one parameter is associated with at least one weighted coefficient of the second transfer function, and the second transfer function is associated with a reciprocal of the first transfer function.

* * * * *